US010360104B2

(12) United States Patent
David

(10) Patent No.: US 10,360,104 B2
(45) Date of Patent: Jul. 23, 2019

(54) ECC MEMORY CONTROLLER TO DETECT DANGLING POINTERS

(71) Applicant: Silicon Laboratories Inc., Austin, TX (US)

(72) Inventor: Thomas S. David, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 114 days.

(21) Appl. No.: 15/589,217

(22) Filed: May 8, 2017

(65) Prior Publication Data
US 2018/0321875 A1 Nov. 8, 2018

(51) Int. Cl.
G06F 11/10 (2006.01)
G06F 11/08 (2006.01)
G06F 12/14 (2006.01)

(52) U.S. Cl.
CPC .......... G06F 11/1076 (2013.01); G06F 11/08 (2013.01); G06F 12/1425 (2013.01); *G06F 2212/1056* (2013.01)

(58) Field of Classification Search
CPC .................................................. G06F 11/1008
USPC ........................................ 714/763, 767, 766
See application file for complete search history.

(56) References Cited

U.S. PATENT DOCUMENTS

| 7,196,562 | B1* | 3/2007 | Luis | G06F 1/08 327/147 |
| 7,814,554 | B1 | 10/2010 | Ragner | |
| 8,572,441 | B2* | 10/2013 | Gove | G06F 21/52 714/49 |
| 8,751,736 | B2* | 6/2014 | Radovic | G06F 9/3824 707/695 |
| 9,195,593 | B1* | 11/2015 | Radovic | G06F 11/073 |
| 9,703,989 | B1 | 7/2017 | Pedersen | |
| 2009/0158124 | A1 | 6/2009 | Kawai et al. | |
| 2009/0276587 | A1 | 11/2009 | Moyer et al. | |
| 2009/0276609 | A1 | 11/2009 | Moyer et al. | |
| 2010/0064181 | A1 | 3/2010 | Moyer | |
| 2012/0102576 | A1 | 4/2012 | Chew | |
| 2013/0013843 | A1* | 1/2013 | Radovic | G06F 11/073 711/5 |
| 2013/0036276 | A1* | 2/2013 | Radovic | G06F 9/3824 711/159 |
| 2013/0036322 | A1* | 2/2013 | Bauer | H04L 41/0668 714/4.1 |

(Continued)

OTHER PUBLICATIONS

Qin et al., "SafeMem: Exploiting ECC-Memory for Detecting Memory Leaks and Memory Corruption During Production Runs," Proceedings of the 11th International Symposium on High-Performance Computer Architecture, 2005.

(Continued)

*Primary Examiner* — Fritz Alphonse
(74) *Attorney, Agent, or Firm* — Nields, Lemack & Frame, LLC

(57) ABSTRACT

A system and method of utilizing ECC memory to detect software errors and malicious activities is disclosed. In one embodiment, after a pool of memory is freed, every data word in that pool is modified to ensure that an ECC error will occur if any data word in that pool is read again. In another embodiment, the ECC memory controller is used to detect and prevent non-secure applications from accessing secure portions of memory.

22 Claims, 10 Drawing Sheets

(56) References Cited

U.S. PATENT DOCUMENTS

| | | |
|---|---|---|
| 2013/0179904 A1* | 7/2013 | Brun .................. G06F 9/542 719/318 |
| 2014/0047296 A1 | 2/2014 | Motabar et al. |
| 2016/0011937 A1 | 1/2016 | Miyamoto et al. |
| 2016/0224418 A1 | 8/2016 | Gueta et al. |
| 2017/0091445 A1 | 3/2017 | Xing et al. |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0181499 A1 | 6/2018 | Branco et al. |
| 2018/0323808 A1 | 11/2018 | David |

OTHER PUBLICATIONS

Notice of allowance dated Oct. 15, 2018 in co-pending U.S. Appl. No. 15/589,199.
Notice of allowance dated Nov. 26, 2018 in co-pending U.S. Appl. No. 15/589,199.

\* cited by examiner

ECC MEMORY CONTROLLER TO DETECT DANGLING POINTERS

BACKGROUND

Error Correction Code (ECC) has been utilized to the correction of errors for many years. Unlike parity, which is above to detect but not correct single bit errors, ECC memory typically can detect multiple bit errors and correct single bit errors. If the number of bits used in the ECC syndrome is increased, double bit errors can also be corrected.

ECC memory has been employed in certain devices for many years. For example, hard disc drives, which have known error rates use ECC to detect and correct data errors for sectors written on a magnetic media. ECC is also employed on CD-ROMS.

However, as semiconductor processes have shrunk, the likelihood of soft errors in semiconductor memory, particularly dynamic memory (DRAM), has increased significantly. Consequently, many memory controllers are implementing ECC to detect and correct these soft errors.

Most ECC memory controllers simply generate a code, known as an ECC syndrome, for each data word written to memory. For example, in certain embodiments, the data word may be 16, 32 or 64 bits, and the ECC syndrome may be 6 or more bits, depending on the size of the data word. When that data word is later read from memory, the ECC memory controller compares the stored syndrome to a calculated syndrome. If the syndromes match, then the data is passed to the application or processor requesting the data. If the syndromes do not match, but the ECC memory controller can correct the error, the error is corrected and the data is passed to the application or processor requesting the data. In some cases, the application is notified that a correctable error was detected. Finally, if the syndromes do not match and the ECC memory controller cannot correct the error, a system error or fault is created by the ECC memory controller. This may cause the processor to execute a special exception procedure.

The use of ECC memory may allow controllers to implement many advanced features, which cannot be implemented without the use of ECC memory.

Therefore, it would be beneficial if there was an ECC memory controller that could be utilized to detect certain software errors. This may be advantageous in debugging software programs or in detecting malicious activities.

SUMMARY

A system and method of utilizing ECC memory to detect software errors and malicious activities is disclosed. In one embodiment, after a pool of memory is freed, every data word in that pool is modified to ensure that an ECC error will occur if any data word in that pool is read again. In another embodiment, the ECC memory controller is used to detect and prevent non-secure applications from accessing secure portions of memory.

According to one embodiment, a system for detecting dangling pointers is disclosed. The system comprises an ECC memory controller adapted to be in communication with a data memory and an ECC memory; wherein the ECC memory controller comprises a state machine, wherein the state machine writes an erroneous data word to the data memory at a data address and an erroneous ECC syndrome to the ECC memory at the data address. In certain embodiments, the state machine repeats the steps of: incrementing the data address after writing the erroneous data word and the erroneous ECC syndrome; and writing the erroneous data word to the data memory and the erroneous ECC syndrome to the ECC memory at the data address; until the number of data addresses has been written. In certain embodiments, the erroneous data word and the erroneous ECC syndrome are written to denote that memory at the data address has been freed.

According to another embodiment, a method of detecting dangling pointer is disclosed. The method comprises writing erroneous data word to the data memory and an erroneous ECC syndrome to the ECC memory at the memory address, where the erroneous data word and erroneous ECC syndrome are selected to as to generate an ECC error; and reading the erroneous data word and the erroneous ECC syndrome at the memory address at a later time; and generating an ECC error after the reading.

According to another embodiment, a system for detecting dangling pointers is disclosed. The system comprises an ECC memory controller adapted to be in communication with a data memory and an ECC memory; wherein the ECC memory controller comprises a state machine, wherein the state machine reads a syndrome stored in the ECC memory at an ECC address, corrupts the syndrome by inverting at least one bit, and writes the corrupted syndrome back to the ECC memory at the ECC address.

According to another embodiment, a system for detecting dangling pointers is disclosed. The system comprises an ECC memory controller adapted to be in communication with a data memory and an ECC memory; wherein the ECC memory controller comprises a state machine, wherein the state machine reads a data word stored in the data memory at a data address, corrupts the data word by inverting at least one bit, and writes the corrupted data word back to the ECC memory at the data address.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
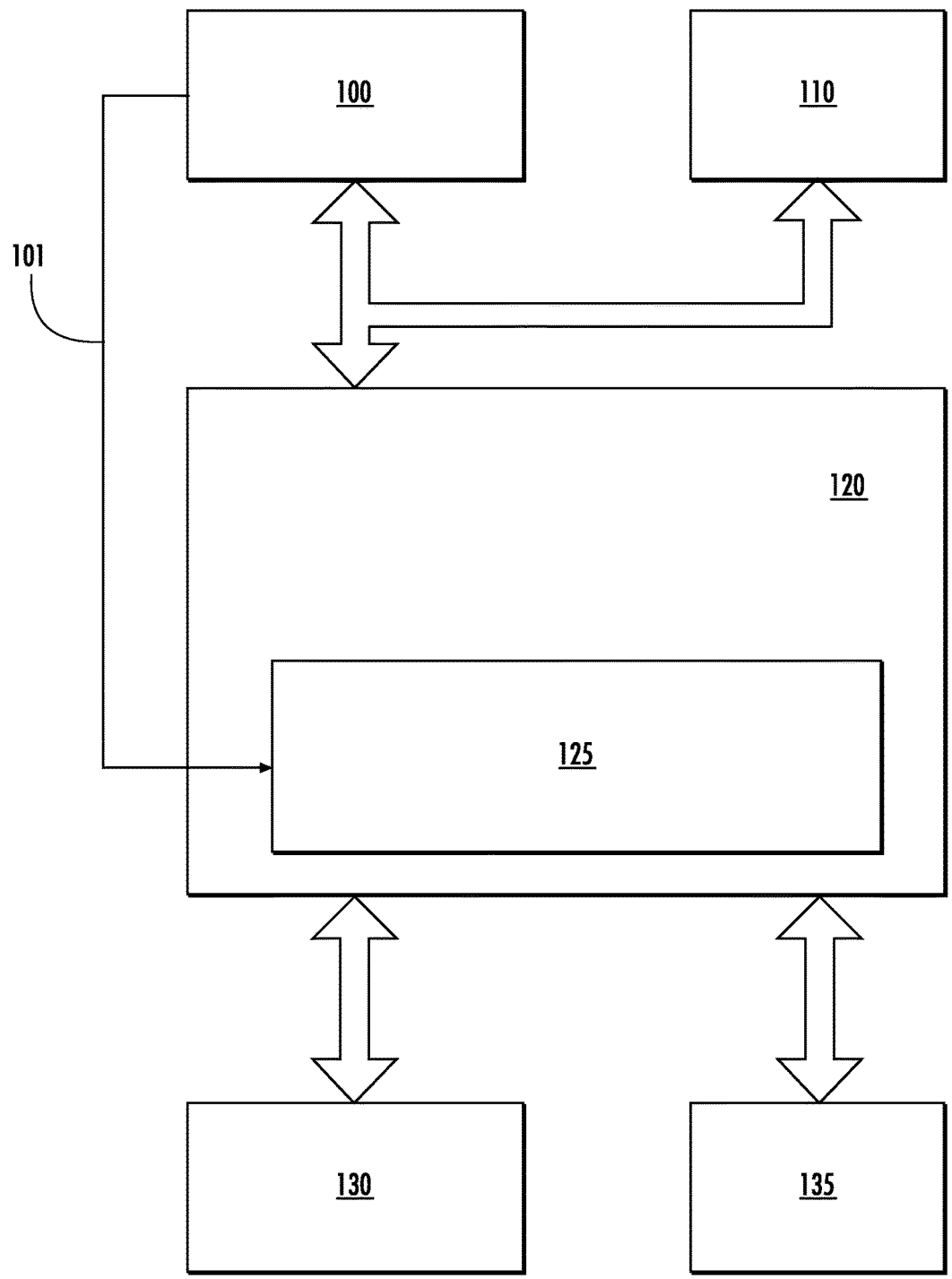
FIG. 1 is a block diagram of a system utilizing the ECC memory controller according to one embodiment.

FIG. 1 shows a block diagram of a representative system using the ECC memory controller. The system comprises a processor 100 and optionally, a local memory device 110.

The processor 100 can be implemented in numerous ways, such as with dedicated hardware, or with general purpose hardware, such as personal computers, that is programmed using microcode or software to perform the functions recited herein. The processor 100 may be a single component, or may be integrated into the memory controller 120.

This local memory device 110 may contain the instructions, which, when executed by the processor 100, enable the system to perform the functions described herein. This local memory device 110 may be a non-volatile memory, such as a FLASH ROM, an electrically erasable ROM or other suitable devices. In other embodiments, the local memory device 110 may be a volatile memory, such as a RAM or DRAM.

While a local memory device 110 is disclosed, any computer readable medium may be employed to store these instructions. For example, read only memory (ROM), a random access memory (RAM), a magnetic storage device, such as a hard disk drive, or an optical storage device, such as a CD or DVD, may be employed. Furthermore, these instructions may be downloaded into the local memory device 110, such as for example, over a network connection (not shown), via CD ROM, or by another mechanism. These instructions may be written in any programming language and is not limited by this disclosure. Thus, in some embodiments, there may be multiple computer readable media that contain the instructions described herein. The first computer readable media may be in communication with the processor 100, as shown in FIG. 1. The second computer readable media may be a CDROM, or a different memory device, which is located remote from the system. The instructions contained on this second computer readable media may be downloaded onto the local memory device 110 to allow execution of the instructions by the system.

The system includes a memory controller 120. This memory controller 120 interfaces with the processor 100 and coordinates operations within the system. For example, the memory controller 120 may include a memory map therein, which defines what each address space of the processor corresponds to. For example, one portion of the address map may correspond to addresses in local memory device 110. Another portion of the address space may correspond to hardware devices, such as USB, PCI Express, and storage devices. Another portion of the address space may correspond to internal registers within the memory controller 120. Finally, another portion of the address space may correspond with data memory 130. Unlike the local memory device 110, data memory 130 also includes an ECC memory 135. The data memory 130 may be organized as a plurality of data words, where each data word is protected by a respective ECC syndrome contained within ECC memory 135. The data memory 130 may be organized in data words having widths of 8, 16, 32, 64 or 128 bits, as determined by the particular design specification. Of course, the data words may have any arbitrary width, such as an arbitrary power of 2. The ECC memory 135 is organized as a plurality of ECC syndromes, where the width of the ECC syndrome is determined, at least in part, by the width of the data word in the data memory 130.

Within the memory controller 120 is the ECC memory controller 125, which provides various functions associated with ECC memory, such as generating ECC syndromes for write operations, verifying ECC syndromes on read operations, correcting single bit bits on read operations, detecting double bit errors on read operations, and other functions that will be described below.

While the above description discloses that the instructions are stored in local memory device 110, in certain embodiments, the instructions executed by the processor 100 may be stored in data memory 130. In this embodiment, the local memory device 110 may not be employed.

The use of ECC memory allows for the detection of software bugs as well as malicious activities.

One software bug, which may also be indicative of a malicious attack, is the access of secure memory by a non-secure application or process. To detect this type of access, the ECC memory controller 125 adopts a unique and novel approach.

Figure 2:
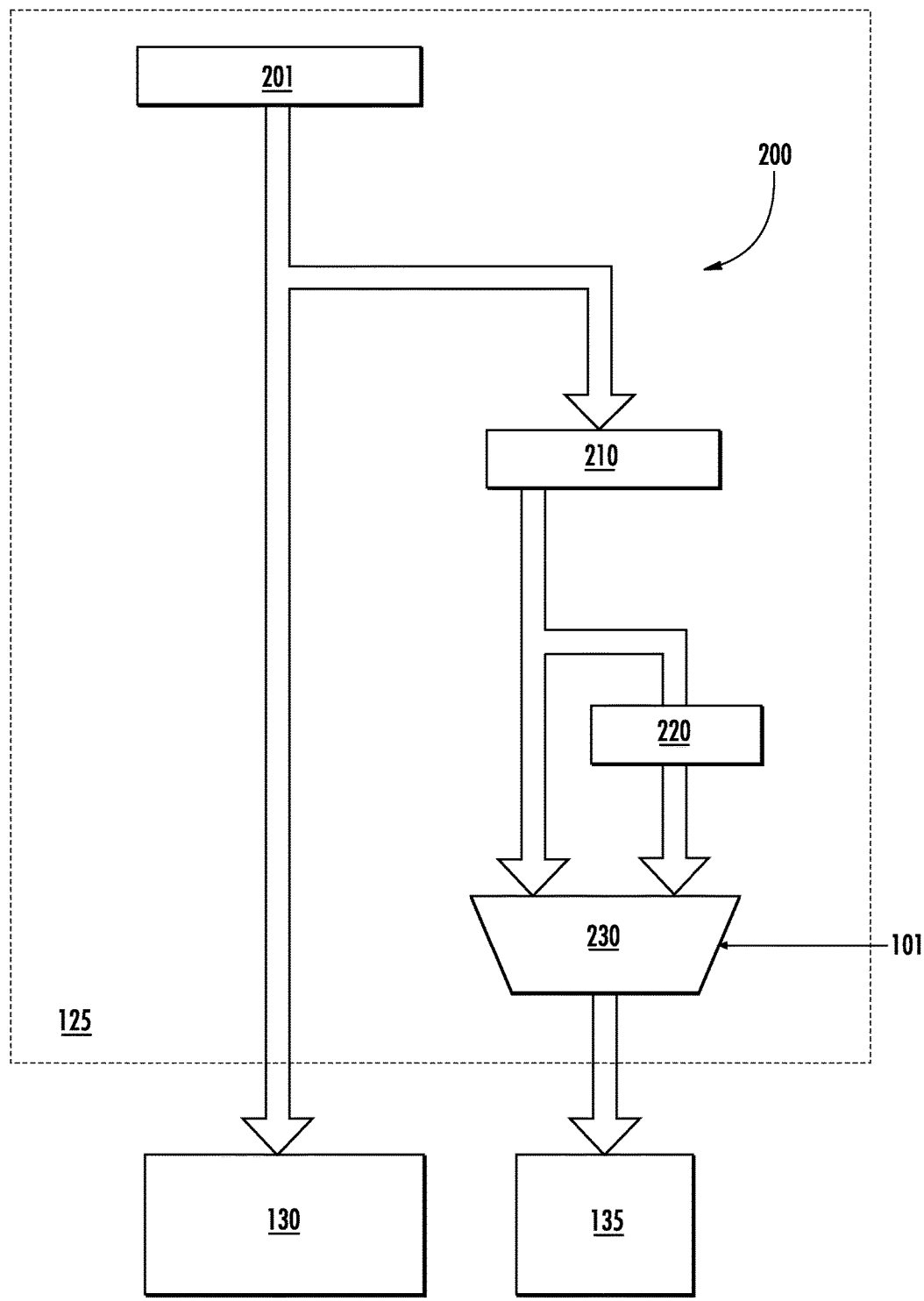
FIG. 2 shows the write logic block of the ECC memory controller according to one embodiment.

FIG. 2 shows a block diagram of the write logic block 200 of the ECC memory controller 125. As was shown in FIG. 1, the ECC memory controller 125 interfaces with the data memory 130 and the ECC memory 135. A data word 201 which is to be written is passed to the write logic block 200. This data word 201 may be an arbitrary number of bits, as described above. This data word 201 is passed directly to the data memory 130. The data word 201 is also input to a syndrome generator 210. The syndrome generator 210 takes the data word 201 as an input and creates a syndrome based on that data word 201. In certain embodiments, the syndrome generator 210 creates a syndrome having a plurality of bits, where each bit of the syndrome is the exclusive OR of a unique combination of bits in the data word 201. Of course, other logic may be used. As described above, the syndrome may be able to detect two bit errors and correct single bit errors. The output of the syndrome generator 210 is then passed to a multiplexor 230 and a syndrome modifier function 220. The syndrome modifier function 220 is used to modify or change the syndrome in a predetermined manner. Thus, the syndrome modifier function 220 is a logic block which accepts the syndrome as an input, modifies that syndrome in some predetermined way, and outputs a modified version of that syndrome.

For example, in one embodiment, the syndrome modifier function 220 may invert all of the bits of the syndrome. In another embodiment, the syndrome modifier function 220 may invert less than all of the bits. By inverting some or all of the bits, it is assured that the syndrome is no longer correct. Other functions, such as shifting or arithmetic operations, may be performed, but these functions may not guarantee an incorrect syndrome. The output of the syndrome modifier function 220 also passes to the multiplexor 230.

A secure mode signal 101, which originates from the processor 100, may be used as the select signal for the multiplexor 230. If the memory is being written by a non-secure application, the syndrome output by the syndrome generator 210 is written to the ECC memory 135. If, on the other hand, the memory is being written by a secure application, the modified syndrome output from the syndrome modifier function 220 is written to the ECC memory 135.

While FIG. 2 shows the syndrome modifier function 220 as receiving the output of the syndrome generator 210, other embodiments are also possible. For example, the syndrome modifier function 220 may receive the data word 201 as an input and generate a modified syndrome based on the data word 201. This may be done by replicating the logic used in the syndrome generator 210, but inverting one or more of the outputs. As before, the output from the syndrome generator 210 and the output from the syndrome modifier function 220 may be inputs to a multiplexor 230.

In yet another embodiment, the syndrome modifier function 220 receives the syndrome from the syndrome generator 210. The syndrome modifier function 220 also receives the secure mode signal 101. The syndrome modifier function 220 then either modifies the syndrome or passes it unchanged, depending on the state of the secure mode signal 101. In this embodiment, a multiplexor 230 is not employed.

Figure 3A:
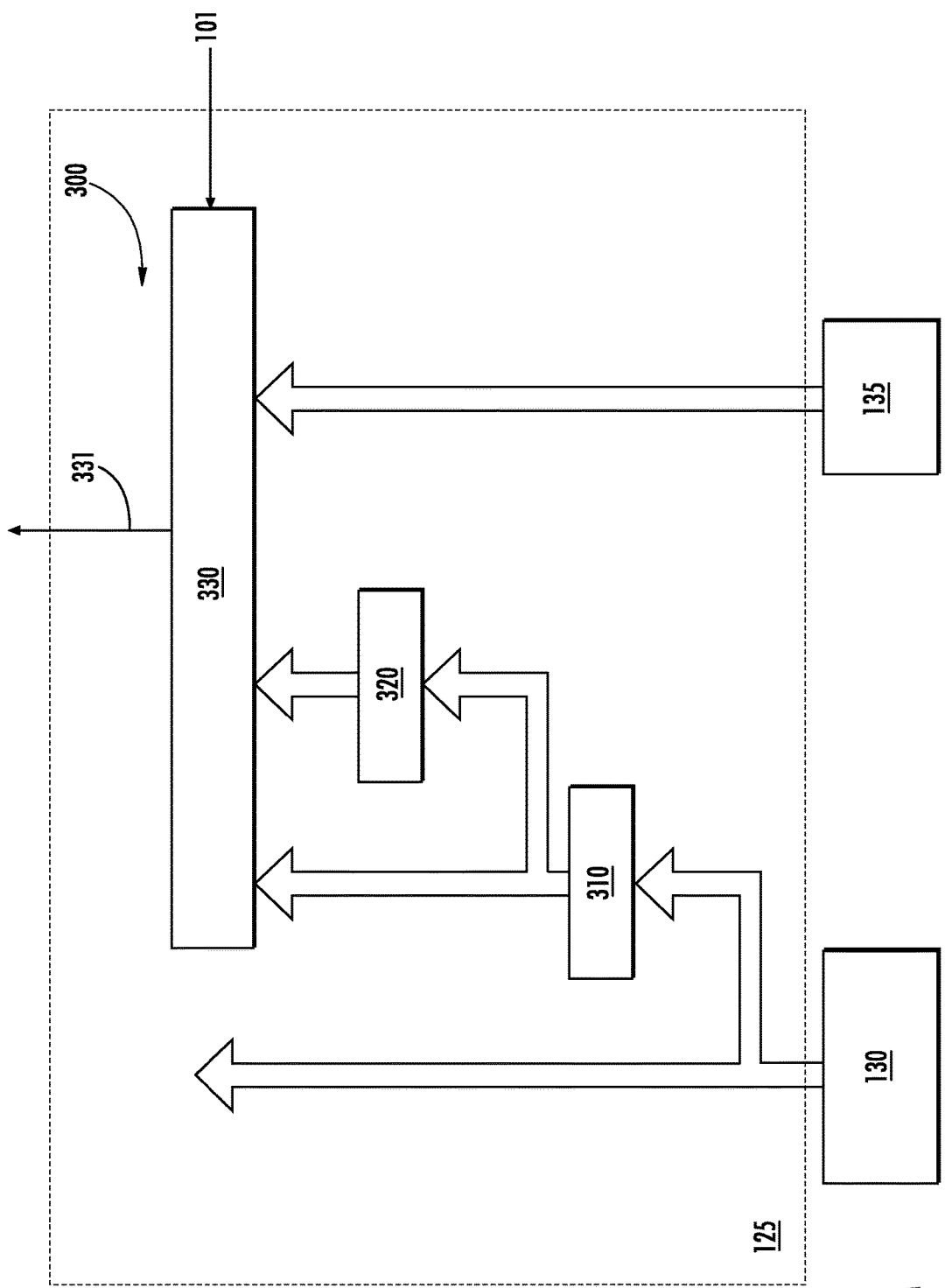
FIG. 3A shows the read logic block of the ECC memory controller according to one embodiment.

FIG. 3A shows one embodiment of the read logic block 300 that is contained within the ECC memory controller 125. Like the write logic block 200, the read logic block 300 interfaces with the data memory 130 and the ECC memory 135. When a data word is read from the data memory 130, the corresponding syndrome is read from the ECC memory 135. A syndrome is calculated for the data word using the syndrome generator 310. This syndrome generator 310 may be identical to syndrome generator 210. In certain embodiments, syndrome generator 210 in the write logic block 200 and syndrome generator 310 in the read logic block 300 are the same logic block. The output of the syndrome generator 310 may be referred to as the calculated syndrome.

Also included in the write logic block is the syndrome modifier function 320. This syndrome modifier function 320 is configured to modify the calculated syndrome in the same manner as syndrome modifier function 220. The output of this syndrome modifier function 320 may be referred to as the calculated modified syndrome. Thus, in the embodiment shown in FIG. 3A, the output of the syndrome generator 310 serves as the input to the syndrome modifier function 320. In another embodiment, the input to the syndrome modifier function 320 may be the data word from the data memory 130, as it is for the syndrome generator 310. The syndrome modifier function 320 may perform the same logic operations as the syndrome modifier function 220. In certain embodiments, these may be the same logic block. Thus, for a particular data word, the output of the syndrome modifier function 320 is the same as the output of the syndrome modifier function 220. Thus, in secure mode, the output of the syndrome modifier function 320 (i.e. the calculated modified syndrome) should match the ECC syndrome, if that syndrome was written while in secure mode.

The calculated syndrome, the calculated modified syndrome and the ECC syndrome from ECC memory 135 are all passed to comparator 330. Comparator 330 also has the secure mode signal 101 as an input. The comparator 330 is used to determine whether an ECC error has occurred. The logic of the comparator is as follows.

When secure mode signal 101 indicates that a non-secure access is being made, the comparator 330 compares the calculated syndrome from the syndrome generator 310 with the ECC syndrome from the ECC memory 135. If these two values match, then there is no ECC error and the data is passed to the processor 100. If these two values do not match, the ECC memory controller 125 may attempt to correct the ECC error. This correction may be performed based on detecting which bits differ between the calculated syndrome and the ECC syndrome. If it cannot be corrected, an ECC error 331 is reported, and an exception may be generated. Thus, non-secure accesses to data memory 130 assume that the ECC syndrome that is written to ECC memory 135 is the correct syndrome. Any other syndrome results in an ECC error 331.

In contrast, when secure mode signal 101 indicates that a secure access is being made, the comparator 330 behaves differently. In this case, the comparator 330 checks whether the ECC syndrome read from the ECC memory 135 matches either the calculated syndrome output from the syndrome generator 310, or the calculated modified syndrome output from the syndrome modifier function 320. If the ECC syndrome matches either of these values, then the data is returned to the processor 100. If the ECC syndrome matches the calculated syndrome, the data word was written in non-secure mode. If the ECC syndrome matches the calculated modified syndrome, the data word was written in secure mode. If the ECC syndrome does not match either of these values, then the read logic block 300 may attempt to correct the error. If it cannot be corrected, then an ECC error 331 is reported. In this way, a secure mode application is able to read memory that was either written by a secure mode application or by a non-secure mode application.

In a variation of this embodiment, the comparator 330 may only compare the calculated modified syndrome to the ECC syndrome read from the ECC memory 135. In this way, secure mode applications can only access secure memory.

Figure 3B:
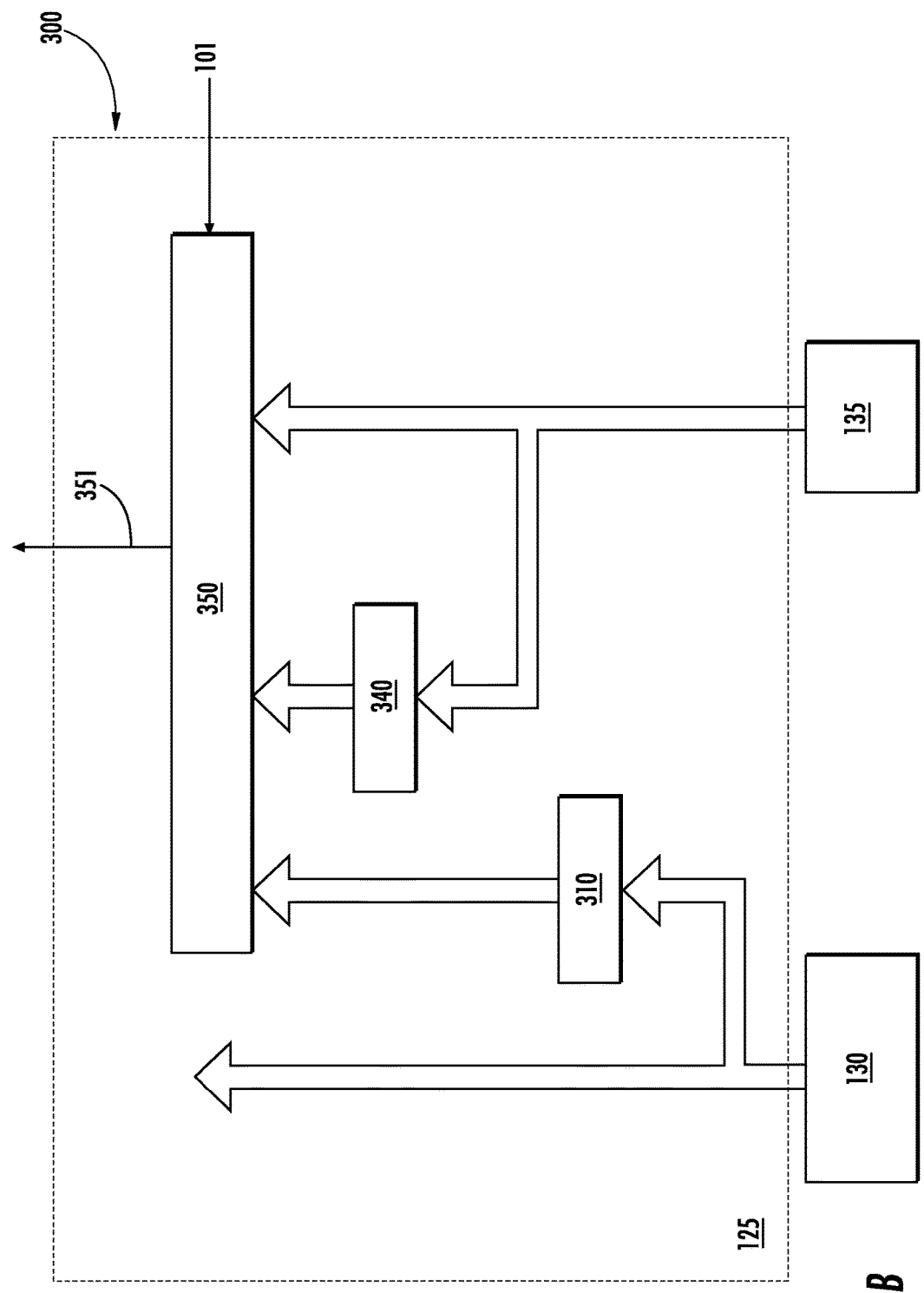
FIG. 3B shows the read logic block of the ECC memory controller according to a second embodiment.

FIG. 3B shows a second embodiment of the read logic block 300. In this embodiment, an ECC syndrome modifier function 340 operates on the ECC syndrome read from the ECC memory 135. In this embodiment, the ECC syndrome modifier function 340 serves to perform the inverse function of syndrome modifier function 220. In other words, the ECC syndrome modifier function 340 converts a stored modified ECC syndrome back into the original ECC syndrome. If the syndrome modifier function 220 performs bit inversions on some or all of the bits in the syndrome, then the ECC syndrome modifier function 340 performs the same bit inversions. This is because two bit inversions return the syndrome to its original value.

The output of the ECC syndrome modifier function 340 may be referred to as the modified ECC syndrome.

In this embodiment, the logic of the comparator is as follows.

When secure mode signal 101 indicates that a non-secure access is being made, the comparator 350 compares the calculated syndrome from the syndrome generator 310 with the ECC syndrome from the ECC memory 135. If these two values match, then there is no ECC error and the data is passed to the processor 100. If these two values do not match, the ECC memory controller 125 may attempt to correct the ECC error. This correction may be performed based on detecting which bits differ between the calculated syndrome and the ECC syndrome. If it cannot be corrected, an ECC error 351 is reported, and an exception may be generated. Thus, non-secure accesses to data memory 130 assume that the ECC syndrome that is written to ECC memory 135 is the correct syndrome. Any other syndrome results in an ECC error 351.

In contrast, when secure mode signal 101 indicates that a secure access is being made, the comparator 350 behaves differently. In this case, the comparator 350 checks whether the calculated syndrome output from the syndrome generator 310 matches either the ECC syndrome read from the ECC memory 135, or the modified ECC syndrome output from the ECC syndrome modifier function 340. If the calculated syndrome matches the ECC syndrome, the data word was written in non-secure mode. If the calculated syndrome matches the modified ECC syndrome, the data word was written in secure mode. If the calculated syndrome matches either of these values, then the data is returned to the processor 100. If the calculated syndrome does not match either of these values, then the read logic block 300 may attempt to correct the error. If it cannot be corrected, then an ECC error 351 is reported. In this way, a secure mode application is able to read memory that was either written by a secure mode application or by a non-secure mode application.

In a variation of this embodiment, the comparator 350 may only compare the calculated syndrome to the ECC modified syndrome output from the ECC syndrome modifier function 340. In this way, secure mode applications can only access secure memory.

Thus, in one embodiment, the system includes an ECC memory controller in communication with a data memory and an ECC memory. The ECC memory controller receives a signal, such as a secure mode signal, as an input. Based on the state of the secure mode signal, the ECC memory controller determines the ECC syndrome to be written to the ECC memory for any given data word. Thus, the ECC memory controller is configured to write a first ECC syndrome to the ECC memory for a given data word if the secure mode signal is set to a first value. The ECC memory controller is further configured to write a second ECC syndrome, different from the first ECC syndrome to the ECC memory for that given data word if the secure mode signal is set to a second value.

Furthermore, the ECC memory controller is also configured to modify the ECC syndrome checking based on the state of the secure mode signal. During read operations, if the secure mode signal is set to the first value, the ECC memory controller compares the syndrome read from the ECC memory to the first ECC syndrome. In one embodiment, if the secure mode signal is set to the second value, the ECC memory controller compares the syndrome read from the ECC memory to the first ECC syndrome and the second ECC syndrome. In another embodiment, if the secure mode signal is set to the second value, the ECC memory controller compares the syndrome read from the ECC memory to the second ECC syndrome. If the syndrome read from the ECC memory does not match the selected ECC syndrome, an ECC error results.

Stated differently, the ECC memory controller performs a first comparison if the secure mode signal is a first value, and performs a second comparison if the secure mode is a second value. As described above, the first comparison is between the calculated syndrome and the ECC syndrome read from the ECC memory. In some embodiments, such as that shown in FIG. 3A, the second comparison is between the calculated modified syndrome and the ECC syndrome. In certain embodiments, such as that shown in FIG. 3B, the second comparison is between the ECC modified syndrome and the calculated syndrome. In certain embodiments, the second comparison also includes performing the first comparison.

Thus, as described above, the ECC memory controller 125 allows a memory to be partitioned into secure and non-secure regions. The ECC syndrome for each data word is determined based on the status of the secure mode signal 101 from the processor 100, when the data word is being written. Thus, unlike other approaches which allow one or more address ranges to be designated as secure memory, the present system allows this designation to be made on data word granularity. Further, unlike other approaches which allow a limited number of address ranges to be designated as secure mode, there is no limit to the number or location of the secure memory in the present embodiment. Furthermore, the present scheme does not require the initialization of address range registers which designate the secure memory regions. Finally, the present mode allows memory to dynamically change from secure mode to non-secure mode, simply by rewriting the data with the secure mode signal 101 set to the opposite value. Thus, unlike other approaches, secure memory regions do not need to be statically allocated.

Thus, the present disclosure describes a method of partitioning a memory into secure and non-secure regions. This method includes calculating a first ECC syndrome to be written with a data word if the secure mode signal is not asserted, and calculating a second ECC syndrome, different from the first ECC syndrome, to be written with the data word if the secure mode signal is asserted, and writing either the first ECC syndrome or the second ECC syndrome, based on the assertion of the secure mode signal, when the data word is written to the data memory. Further, the method includes reading the data word from data memory at a later time, computing a calculated syndrome for the data word when the data word is read from the data memory and comparing the calculated syndrome to the ECC syndrome read from ECC memory is the secure mode signal is not asserted. In some embodiments, the method also includes computing a modified calculated syndrome, different than the calculated syndrome, for the data word; and comparing the modified calculated syndrome to the ECC syndrome read from the ECC memory if the secure mode signal is asserted. In other embodiments, the method also includes computing a modified ECC syndrome from the ECC syndrome read from the ECC memory; and comparing the calculated syndrome to the modified ECC syndrome if the secure mode signal is the second value. Based on the results of these comparisons, an ECC error may be indicated.

The ECC memory controller 125 also performs other functions. For example, one common software error is the access of memory that has been released or freed. For example, a software application may utilize a pointer, which points to a particular block of memory, where the size of that block of memory may be any integral number of data words. This function may be achieved by first requesting a block of memory and then indicating that a pointer points to this requested block. In the C computer language, this may be achieved using the following syntax:

int*ptr=malloc(Byte_Count);

This statement allocates a block of memory of size "Byte_Count" and uses a pointer called "ptr" to point to that block of memory.

At a later time during the application's execution, this block of memory may no longer be needed. It is then released, or freed. In the C computer language, this may be achieved using the following syntax:

free(ptr);

The same types of commands are also present in other computer languages, and the present disclosure is not limited to the C programming language.

While the "free" command frees the block of memory, allowing it to be used by other process or applications, note that the pointer, ptr, is still pointing to this freed block of memory. Thus, if the application references memory using the value stored in the ptr pointer, unpredictable results will occur. For example, if the memory has not been allocated to another process or application, the last data written may still be in this block of memory, making it appear as though no error has occurred. In other scenarios, the block of memory may now be allocated to a different process or application. In this case, the access may return erroneous data. Furthermore, in the case of a write operation, the new data will corrupt the data being used by the other process or application.

This issue is commonly referred to as a dangling pointer, and these dangling pointers are often difficult to uncover during software development. The present ECC memory controller is configured to aid in the detection of a dangling pointer, as described below.

An ECC error may be intentionally created to detect an access to a freed block of memory. This may be achieved in a number of ways. According to a first embodiment, shown in FIG. 4, a logic block is incorporated into the ECC memory controller 125 to intentionally corrupt the ECC memory 135.

Specifically, the logic block includes a state machine 400, and an ECC syndrome corruption function 410. The state machine 400 may comprise a hardware circuit which performs the described actions. The design of such a state machine is well known in the art. In another embodiment, the state machine 400 may be a microcontroller that is programmed to perform these actions. The state machine 400 also includes two registers; a starting address register 401 and a word count register 402. In another embodiment, the state machine 400 includes an ending address register rather than a word count register. In other words, the state machine 400 includes a second register that allows it to determine how many data words are part of the freed block of memory. However, the function of the state machine 400 is unchanged in this embodiment. When a block of memory is freed, the process or application that freed the memory also loads the starting address of that block of memory into the starting address register 401. The size of the block of memory is then loaded into the word count register 402. When the state machine 400 is instructed to begin, it places the address in the starting address register 401 on its address bus, which also interfaces with the ECC memory 135. The state machine 400 also manipulates the control signals to the ECC memory 135 to perform a read operation. The syndrome stored in this particular address is then passed to the ECC syndrome corruption function 410. The ECC syndrome corruption function 410 then corrupts this syndrome. In certain embodiments, this may be achieved by inverting one or more bits in the syndrome. For example, in certain embodiments, at least two bits may be inverted to ensure that a non-correctable ECC error is generated.

Furthermore, if the secure mode function is included in the ECC memory controller 125, it may be desirable to invert bits in positions such that both the normal ECC syndrome and the modified ECC syndrome generate an uncorrectable ECC error. For example, assume that the ECC memory 135 stored a 7-bit syndrome. Further assume that the modified ECC syndromes used in secure mode invert a group of N bits. To ensure that an uncorrectable ECC error occurs, at least M bits which are not part of the group of N inverted bits may be inverted. This embodiment assumes that N is at least M less than the size of the syndrome. In other words, if 4 bits of the 7-bit syndrome are inverted for the secure mode syndrome, and M is equal to 2, then at least 2 of the 3 remaining bits would be inverted by the ECC syndrome corruption function 410. If N is not at least M less than the size of the syndrome, then at least M bits of the N bits may be inverted, as long as N is at least 2M. In other words, if 6 bits of the 7-bit syndrome are inverted for the secure mode syndrome, then at least M of the 6 inverted bits would be inverted by the ECC syndrome corruption function 410, as long as at least M of the 6 bits are not inverted.

The logic associated with the ECC syndrome corruption function 410 is as follows. Let X be the number of bits in the ECC syndrome. Let N be the number of bits in the X bit ECC syndrome that are inverted for the secure syndrome. Let M be the number of bits that are inverted by the ECC syndrome corruption function 410.

If (X>N+M)
{invert M of the remaining bits, where M≤X−N}
Else
{invert M of the previously inverted N bits, where M≤N−M}

Furthermore, a combination of these approaches may be taken where at least one previously inverted bit is inverted again, while at least one remaining bit is also inverted.

Thus, in one embodiment, the ECC syndrome is 7 bits, and the secure mode syndrome inverts all 7 bits. In this embodiment, between 1 and 6 bits are inverted by the ECC syndrome corruption function 410. This ensures at least 1 bit are in error, regardless of whether the syndrome is a secure mode syndrome or a non-secure mode syndrome.

The width of the data word and the ECC syndrome may help define the exact function of the ECC syndrome corruption function 410. For example, in a system with 32 bit data words, and 7 bit ECC syndromes, there are certain ECC residues which should not occur. An ECC residue is defined in this disclosure as the exclusive OR of the ECC syndrome read from the ECC memory 135 and the calculated ECC syndrome. The ECC syndrome corruption function 410 may be configured to create an ECC residue which cannot be the result of a 1 bit error. The use of ECC residues to correct single bit errors is well known and will not be described herein.

While the previous description assumes that the ECC syndrome corruption function 410 operates in a system which also includes a memory portioned into a secure mode and a non-secure mode, other embodiments are also possible. For example, the ECC syndrome corruption function 410 may be used in a ECC memory controller 125 that does not include the secure mode functions shown in FIGS. 2, 3A and 3B.

Figure 5:
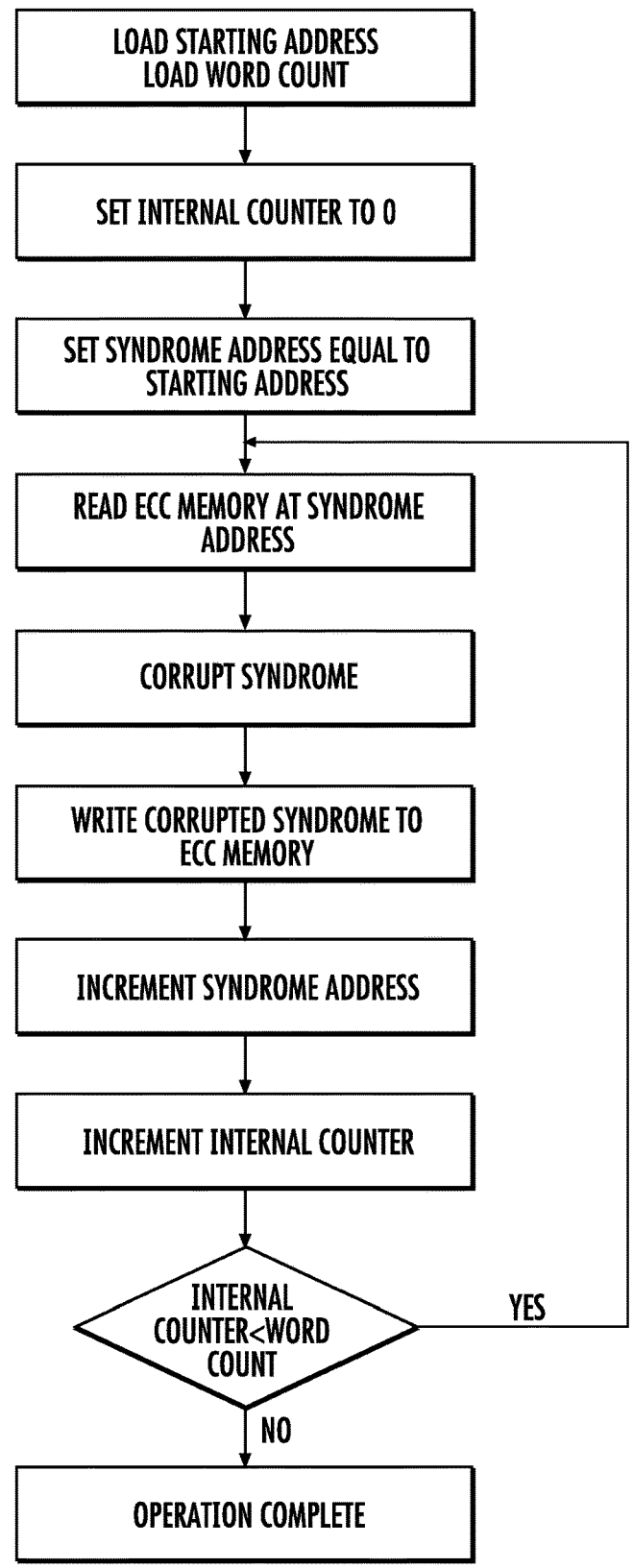
FIG. 5 illustrates a flowchart showing the operation of the logic shown in FIG. 4.

After corrupting the syndrome that was read from the ECC memory 135, the state machine 400 instructs that the new ECC syndrome be written into that same address location. If the word count register contains a value greater than 1, the state machine 400 then increments the address, and increments an internal counter. If that internal counter has a value less than the word count register 402, the state machine 400 then repeats the procedure described above. After the procedure is repeated, the internal counter is incremented again and compared to the word count register 402. If the internal counter is still less than the word count register 402, the procedure repeats. This continues until the value of the internal counter matches the value of the word count register 402, at which point the state machine 400 stops. A flowchart of this operation is shown in FIG. 5.

While the above description describes a state machine that corrupts the ECC syndrome without affecting the data memory 130, other embodiments are also possible. In one such embodiment, rather than corrupting the ECC syndrome, the data word is corrupted. Thus, in this embodiment, shown in FIG. 6, the ECC syndrome corruption function 410 is replaced with a data word corruption function 430, which interfaces with the data memory 130. This rest of the logic remains unchanged, including the operation of the state machine 400. A flowchart of this embodiment is shown in FIG. 7.

Figure 4:
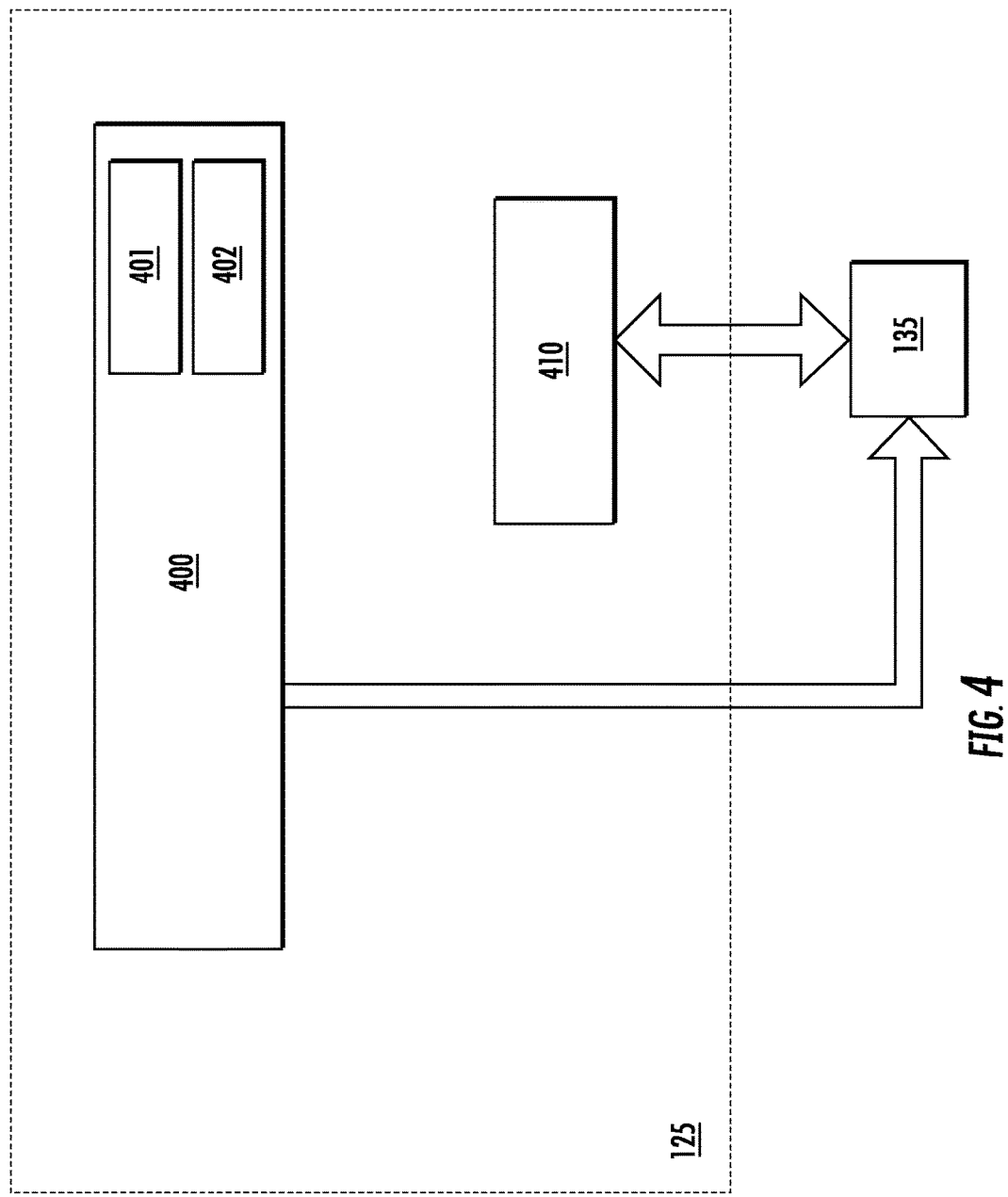
FIG. 4 shows logic contained within the ECC memory controller to invalidate freed memory according to one embodiment.
Figure 6:
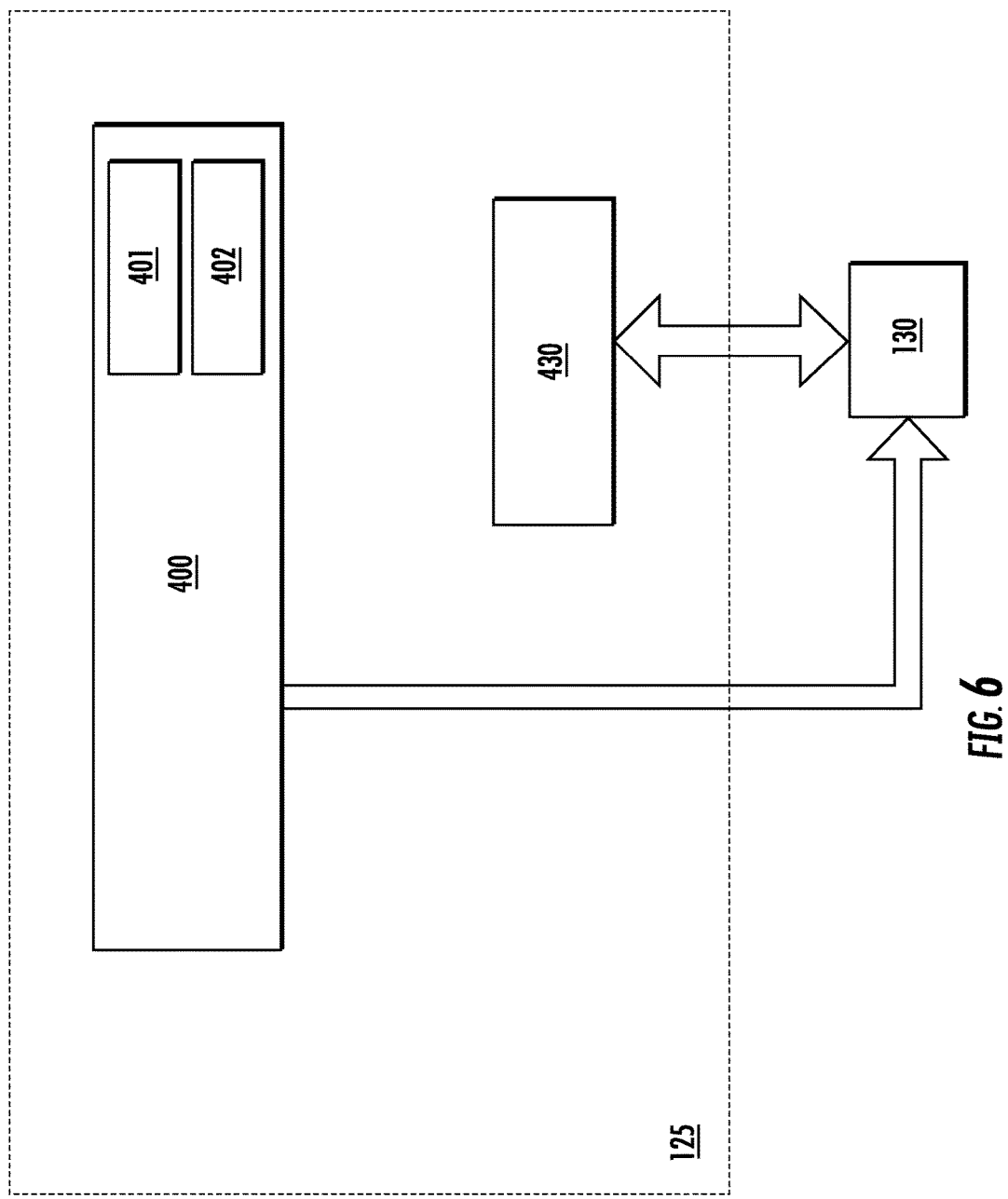
FIG. 6 shows logic contained within the ECC memory controller to invalidate freed memory according to a second embodiment.
Figure 7:
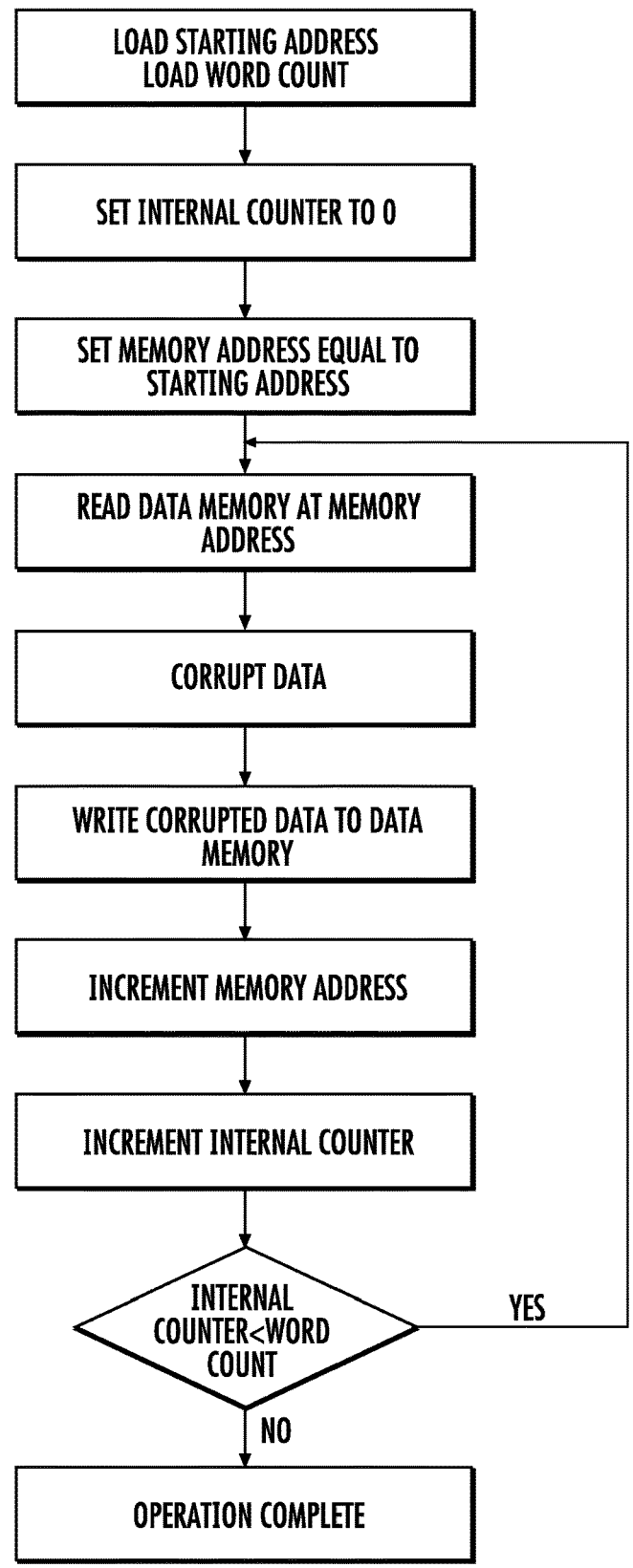
FIG. 7 illustrates a flowchart showing the operation of the logic shown in FIG. 6.

While FIGS. 4 and 6 show the state machine 400 interfacing with only one of the data memory 130 and the ECC memory 135, other embodiments are also possible. For example, in certain embodiments, the state machine 400 may issue a read command to both the data memory 130 and the ECC memory 135. In this embodiment, one or both of the values read from these memories are then corrupted and written back to the data memory 130 and the ECC memory 135.

As an example, in FIG. 4, a data word may also be read from data memory 130. This data word may not be corrupted by the ECC syndrome corruption function 410. Thus, when the data word and the syndrome are written back, the same data word is returned to the data memory 130, while a corrupt syndrome is written to the ECC memory 135.

Similarly, in FIG. 6, a syndrome may also be read from ECC memory 135. This syndrome may not be corrupted by the data word corruption function 430. Thus, when the data word and the syndrome are written back, a corrupt data word is written to the data memory 130, while the original syndrome is written to the ECC memory 135.

In yet another embodiment, the system may include both the ECC syndrome corruption function 410 and the data word corruption function 430. In this embodiment, both the data word and the syndrome are corrupted before being written back to their respective memories.

Therefore, in certain embodiments, the ECC memory controller 125 comprises two different logic blocks that intentionally alter the values of the ECC syndrome. For example, the ECC memory controller 125 may be a syndrome modifier function 220 and an ECC syndrome corruption function 410. As described above, the syndrome modifier function 220 is used to distinguish between secure mode memory and non-secure mode memory. The ECC syndrome corruption function 410 is used to distinguish freed memory from allocated memory. Further, in some embodiments, the ECC syndrome corruption function 410 is defined so that an ECC error is indicated regardless of whether the freed memory was read using secure mode or non-secure mode.

Figure 8:
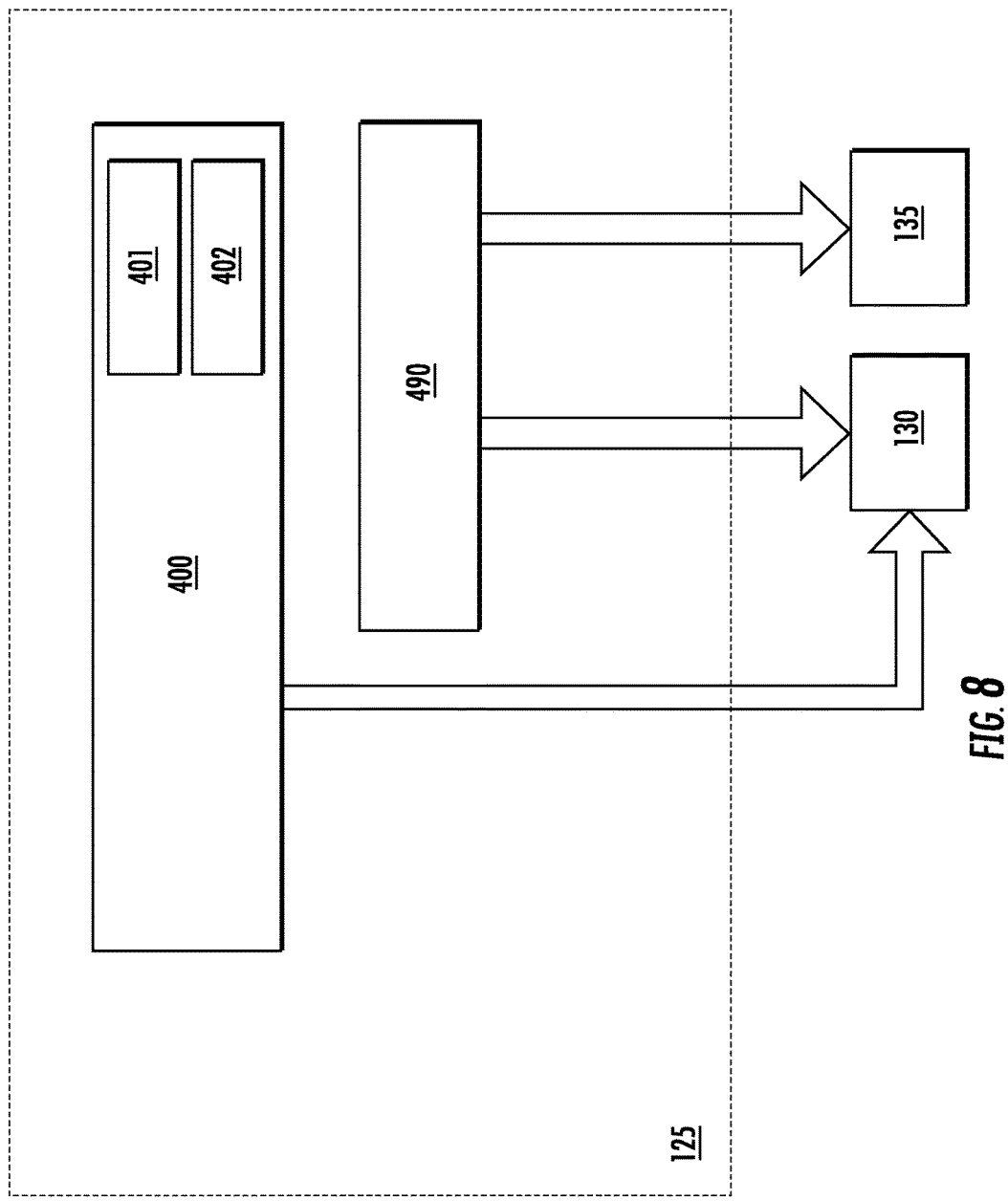
FIG. 8 shows logic contained within the ECC memory controller to invalidate freed memory according to a third embodiment.
Figure 9:
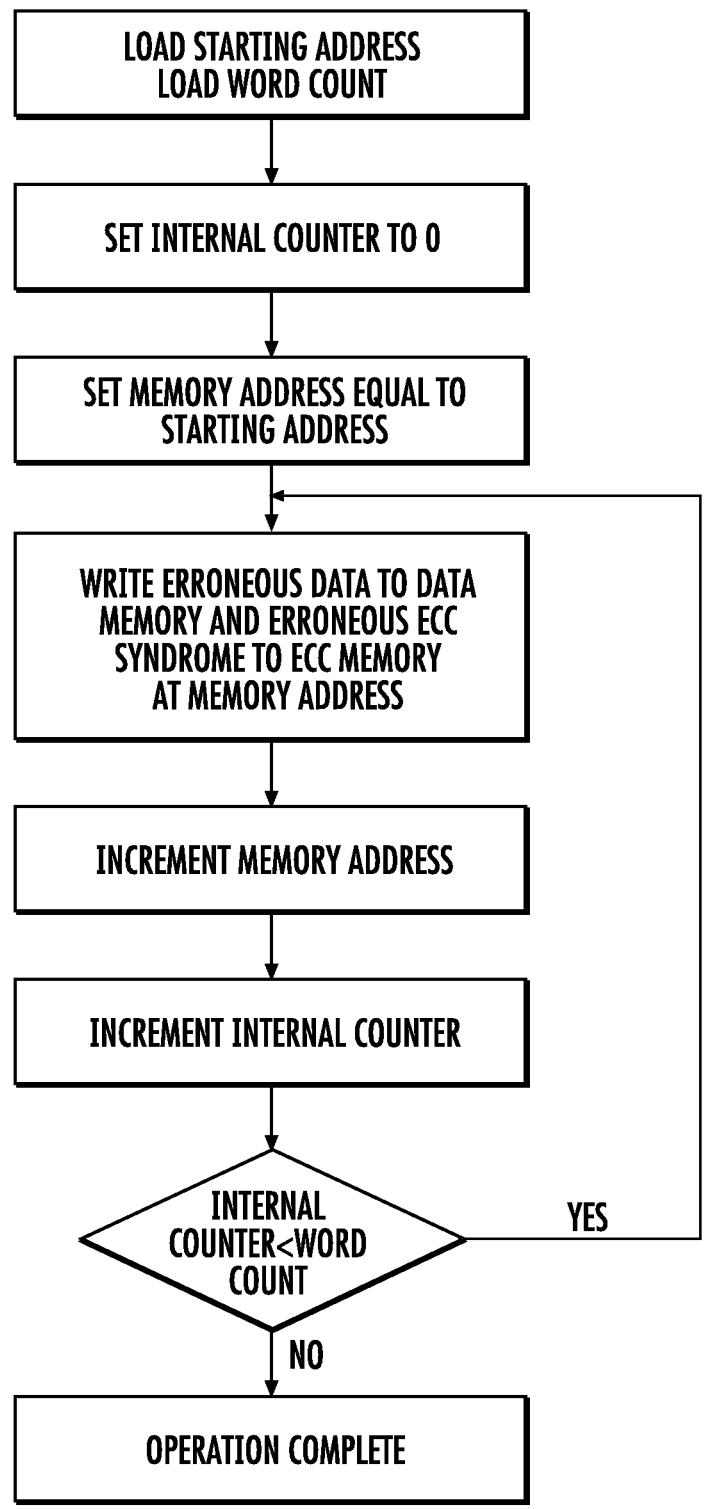
FIG. 9 illustrates a flowchart showing the operation of the logic shown in FIG. 8.

FIGS. 4-7 describe embodiments where either the data memory 130 or ECC memory 135 must be read and then rewritten to corrupt the contents at that particular memory address. However, other embodiments are also possible. For example, FIG. 8 shows another embodiment where the state machine 400 uses an erroneous data block 490. The erroneous data block 490 may comprise a fixed collection of data bits and ECC syndrome that are guaranteed to generate an ECC error. The erroneous data word may be a predetermined pattern of bits, while the erroneous ECC syndrome may be a syndrome that creates an uncorrectable error when used with the erroneous data word. For example, the erroneous data block 490 may simply comprise a set of multiplexers which either pass the data from the processor 100 and the calculated syndrome, or the erroneous data word and the erroneous ECC syndrome. As described above, the state machine 400 also includes two registers; a starting address register 401 and a word count register 402. In another embodiment, the state machine 400 includes an ending address register rather than a word count register. In other words, the state machine 400 includes a second register that allows it to determine how many data words are part of the freed block of memory. The state machine 400 provides the control signals to the data memory 130 and the ECC memory 135 to execute a write operation at a particular memory address. Since the erroneous data block 490 includes both the erroneous data word and the erroneous ECC syndrome, there is no need to read the current contents of the data memory 130 or the ECC memory 135 in order to corrupt the memory location. FIG. 9 shows a flowchart explaining the operation of the state machine 400 in this embodiment.

In each of the embodiments shown in FIGS. 4, 6 and 8, the state machine 400 only operates when instructed to invalidate freed memory. In all other cases, the state machine 400 does not affect the operation of the ECC memory controller 125. FIG. 2 shows the write path for normal operations. In FIGS. 4, 6 and 8, the state machine 400 is also able to access at least one of the data memory 130 or the ECC memory 135. In one embodiment, a set of multiplexors is used to select the output to be written to the data memory 130 and the ECC memory 135. In normal operation, the data word 201 (see FIG. 2) is passed to the data memory 130, while the syndrome from multiplexor 230 is passed to the ECC memory 135. When the state machine 400 is active, data from the data word corruption function 430 (see FIG. 6), or the erroneous data word from erroneous data block 490 (see FIG. 8) is passed to the data memory 130. Similarly, when the state machine 400 is active, syndromes from the ECC syndrome corruption function 410 (see FIG. 4), or the erroneous ECC syndrome from the erroneous data block 490 (see FIG. 8) is passed to the ECC memory 135.

Another common software bug is the use of data in memory that has not been initialized. For example, an application may declare a variable, but prior to ever assigning a value to that variable, read the contents of that variable. The ECC memory controller 125 detects this error as well. Uninitialized memory will almost always contain an ECC error, as the uninitialized syndrome in the ECC memory 135 is not related or computed from the data stored in the data memory 130. Thus, accesses to uninitialized memory will generate an ECC error, which can then be used to detect where in the process or application this erroneous access occurred.

This system has several advantages. First of all, since all of the logic described herein is incorporated into the ECC memory controller 125, no additional cost is incurred to implement these functions.

With respect to the secure mode operation, the present system allows much finer granularity than traditional address filter-based solutions. In the current system, the designation of whether a data word is secure or non-secure is made when the data is being written to memory. There is no need to initialize any address range registers, or initialize address filters to achieve this result.

With respect to the dangling pointers, the present system allows much lower overhead than other software based methods. Specifically, whenever memory is freed, a hardware state machine performs the corruption function without any need for software intervention, except to indicate the address that is to be freed and its size. Thus, performance of the system is minimally impacted, while adding a valuable diagnostic tool.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for detecting dangling pointers, comprising:
an ECC memory controller in communication with a data memory and an ECC memory;
wherein the ECC memory controller comprises a state machine, wherein the state machine writes an erroneous data word to the data memory at a data address and an erroneous ECC syndrome to the ECC memory at the data address.

2. The system of claim 1, wherein the state machine comprises a starting address register to store a starting address and a second register to indicate a number of data addresses to be written.

3. The system of claim 2, wherein the state machine repeats steps of:
incrementing the data address after writing the erroneous data word and the erroneous ECC syndrome; and
writing the erroneous data word to the data memory and the erroneous ECC syndrome to the ECC memory at the data address;
until the number of data addresses has been written.

4. The system of claim 2, wherein the second register comprises a word count register.

5. The system of claim 2, wherein the second register comprises an ending address register.

6. The system of claim 1, wherein the erroneous data word and the erroneous ECC syndrome are written to denote that memory at the data address has been freed.

7. The system of claim 6, wherein an ECC error is indicated if a freed memory location is read.

8. A method of detecting dangling pointers, comprising:
writing erroneous data word to a data memory and an erroneous ECC syndrome to an ECC memory at a memory address using an ECC memory controller, where the erroneous data word and erroneous ECC syndrome are selected to as to generate an ECC error; and
reading the erroneous data word and the erroneous ECC syndrome at the memory address at a later time; and
generating an ECC error after the reading.

9. The method of claim 8, wherein a state machine is disposed in the ECC memory controller, the ECC memory controller adapted to be in communication with a data memory and an ECC memory, the method further comprising, prior to the writing:
loading a starting address into a starting address register in the state machine;
providing an indication of a word count to the state machine; and
using the starting address as a memory address.

10. The method of claim 9, further comprising:
incrementing the memory address after the writing;
incrementing a counter after the writing; and
repeating the writing and incrementing steps if the counter is less than the word count.

11. The method of claim 9, wherein providing an indication of the word count comprising writing the word count to a word count register in the state machine.

12. The method of claim 9, wherein providing an indication of the word count comprising writing a second address to an ending address register in the state machine.

13. A system for detecting dangling pointers, comprising:
an ECC memory controller in communication with a data memory and an ECC memory;
wherein the ECC memory controller comprises a state machine, wherein the state machine reads a syndrome stored in the ECC memory at an ECC address, corrupts the syndrome by inverting at least one bit, and writes the corrupted syndrome back to the ECC memory at the ECC address.

14. The system of claim 13, wherein the state machine comprises a starting address register to store the starting address and a second register to indicate a number of syndromes that are to be corrupted, and wherein the ECC address is initialized to the starting address.

15. The system of claim 14, wherein the state machine repeats steps of:
incrementing the ECC address after writing the corrupted syndrome;
reading a syndrome stored in the ECC memory at the ECC address;
corrupting the syndrome by inverting at least one bit; and
writing the corrupted syndrome back to the ECC memory at the ECC address;
until the number of syndromes has been corrupted.

16. The system of claim 14, wherein the second register comprises a word count register.

17. The system of claim 14, wherein the second register comprises an ending address register.

18. A system for detecting dangling pointers, comprising:
an ECC memory controller in communication with a data memory and an ECC memory;
wherein the ECC memory controller comprises a state machine, wherein the state machine reads a data word stored in the data memory at a data address, corrupts the data word by inverting at least one bit, and writes the corrupted data word back to the data memory at the data address.

19. The system of claim 18, wherein the state machine comprises a starting address register to store the starting address and a second register to indicate a number of words that are to be corrupted, and wherein the data address is initialized to the starting address.

20. The system of claim 19, wherein the state machine repeats steps of:
incrementing the data address after writing the corrupted data word;
reading a data word stored in the data memory at the data address;
corrupting the data word by inverting at least one bit; and
writing the corrupted data word back to the data memory at the data address;
until the number of data words has been corrupted.

21. The system of claim 19, wherein the second register comprises a word count register.

22. The system of claim 19, wherein the second register comprises an ending address register.

* * * * *